US009966393B2

(12) United States Patent
Kim et al.

(10) Patent No.: US 9,966,393 B2
(45) Date of Patent: May 8, 2018

(54) ARRAY SUBSTRATE AND METHOD OF FABRICATING THE SAME

(71) Applicant: LG Display Co., Ltd., Seoul (KR)

(72) Inventors: Jin-Su Kim, Incheon (KR); Sung-Jin Um, Paju-si (KR); Jin-Hyung Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/363,951

(22) Filed: Nov. 29, 2016

(65) Prior Publication Data

US 2017/0092667 A1    Mar. 30, 2017

Related U.S. Application Data

(62) Division of application No. 14/554,879, filed on Nov. 26, 2014, now Pat. No. 9,530,802.

(30) Foreign Application Priority Data

Nov. 29, 2013 (KR) ........................ 10-2013-0147303

(51) Int. Cl.
    *H01L 27/12*    (2006.01)
    *H01L 29/66*    (2006.01)
(52) U.S. Cl.
    CPC ........ *H01L 27/1288* (2013.01); *H01L 27/124* (2013.01); *H01L 27/1262* (2013.01); *H01L 27/1296* (2013.01); *H01L 29/66765* (2013.01)

(58) Field of Classification Search
    None
    See application file for complete search history.

(56) References Cited

U.S. PATENT DOCUMENTS

2006/0148141 A1*  7/2006  Seo ..................... H01L 29/456
                                                          438/151
2009/0017569 A1    1/2009  Moon et al.
2010/0207122 A1    8/2010  Oh et al.

FOREIGN PATENT DOCUMENTS

CN            201788340 U      4/2011

\* cited by examiner

*Primary Examiner* — Michelle Mandala
(74) *Attorney, Agent, or Firm* — Birch, Stewart, Kolasch & Birch, LLP

(57) ABSTRACT

A method of fabricating an array substrate, forming a gate line in a display region and a first auxiliary pattern in a non-display region forming a gate insulating layer on the gate line and the first auxiliary pattern forming a data line in the display region and a second auxiliary pattern in the non-display region over the gate insulating layer, wherein the data line crosses the gate line to define a pixel region forming a passivation layer on the data line and the second auxiliary pattern, and the passivation layer including first and second contact holes respectively exposing the first and second auxiliary patterns forming a planarization layer and a bridge pattern on the passivation layer forming a pixel electrode on the planarization layer and in the pixel region, and a connection pattern on the bridge pattern, wherein the connection pattern contacts the first and second auxiliary patterns.

13 Claims, 21 Drawing Sheets ashing ashing

ARRAY SUBSTRATE AND METHOD OF FABRICATING THE SAME

CROSS-REFERENCE TO RELATED APPLICATIONS

This Application is a Divisional of copending U.S. application Ser. No. 14/554,879, filed on Nov. 26, 2014, which claims the benefit of Patent Application No. 10-2013-0147303, filed in the Republic of Korea on Nov. 29, 2013, the entire contents of which are hereby incorporated by reference.

BACKGROUND OF THE INVENTION

The present invention relates to an array substrate, and more particularly, to an array substrate being capable of preventing a disconnection in a jumper portion and a method of fabricating the array substrate.

As society has entered the information age, a field of display devices that visually represent all sorts of electrical signals as images has developed rapidly. Particularly, liquid crystal display (LCD) devices or organic light emitting diode (OELD) display devices as a flat panel display device having characteristics of light weight, thinness and low power consumption have been developed for use as a substitute for a cathode-ray tube type display devices.

Since LCD devices include a thin film transistor (TFT) as a switching element, referred to as an active matrix LCD (AM-LCD) device, they have excellent characteristics of high resolution for displaying moving images and have been widely used.

On the other hand, since OELD devices have excellent characteristics of high brightness, low power consumption and high contrast ratios, OELD display devices have also been widely used. Moreover, OELD display devices have advantages of a high response rate, a low production cost and so on.

Both LCD devices and the OELD display devices require an array substrate including a thin film transistor (TFT) as a switching element for controlling on and off states of each pixel region. In addition, OELD devices requires another TFT as a driving element for driving an organic electroluminescent diode in each pixel region.

Recently, to meet the requirements of light-weight, thinness and reduced production costs, a gate driving circuit is formed directly on a non-display region of a substrate. It may be referred to as a gate-in-panel (GIP) structure array substrate.

The GIP structure array substrate includes a display region for displaying images, a pad part at an upper portion of the display region, a gate circuit part at a side portion of the display region and a signal input part at a side of the circuit part.

The gate circuit part is connected to each gate line and includes a driving block. In the driving block, a plurality of driving TFTs, which are connected to each other, are formed.

FIG. 1 is a schematic plane view of a non-display region of the related art GIP structure array substrate, and FIG. 2 is a cross-sectional view taken along II-II line of FIG. 1.

As shown in FIGS. 1 and 2, on a substrate, a gate line (not shown) is formed in a display region (not shown), and a first auxiliary line 7 and a first auxiliary pattern 8, which is connected to the first auxiliary line 7, are formed in a non-display region NA. A layer, where the gate line, the first auxiliary line 7 and the first auxiliary pattern 8 are disposed, is referred to as a gate layer. A gate insulating layer 10 is formed on the gate layer, i.e., the gate line, the first auxiliary line 7 and the first auxiliary pattern 8. On the gate insulating layer 10, a source electrode (not shown) and a drain electrode (not shown) are formed in the display region, and a second auxiliary line 37 and a second auxiliary pattern 38, which is connected to the second auxiliary line 37, are formed in a non-display region NA. A layer, where the source electrode, the drain electrode, the second auxiliary line 37 and the second auxiliary pattern 38 are disposed, is referred to as a source-drain layer. A passivation layer 50 is formed to cover the source electrode, the drain electrode, the second auxiliary line 37 and the second auxiliary pattern 38.

First and second contact holes ch1 and ch2, which respectively expose the first and second auxiliary patterns 8 and 38, are formed through the passivation layer 50.

A connection pattern 63 is formed on the passivation layer 50. One end of the connection pattern 63 contacts the first auxiliary pattern 8 through the first contact hole ch1, and the other end of the connection pattern 63 contacts the second auxiliary pattern 38 through the second contact hole ch2. As a result, the first and second auxiliary patterns 8 and 38 are electrically connected to each other. Namely, there is a jumper portion for providing an electrical connection between the gate layer, i.e., the first auxiliary pattern 8, and the source-drain layer, i.e., the second auxiliary pattern 38. The connection pattern 63 is formed at the same layer as a pixel electrode in each pixel region of the display region.

In order to reduce the production costs and simplify the fabrication process, a semiconductor layer (not shown) and the source and drain electrodes are formed by a single mask process. As a result, under the second auxiliary pattern 38, which is formed at the source-drain layer, a dummy semiconductor pattern 21, which includes first and second dummy patterns 21a and 21b, is formed. The dummy semiconductor pattern 21 is formed at the same layer and of the same material as the semiconductor layer.

Since the first and second dummy patterns 21a and 21b and the second auxiliary pattern 38 are formed by a single mask process, ends of the first dummy pattern 21a protrude beyond the second auxiliary pattern 38. It may be referred to as an active tail.

In the mask process, a center portion of an ohmic contact layer, which is formed of impurity-doped amorphous silicon, of the semiconductor layer, should be etched by a dry-etching process, however the gate insulating layer 10 is also undesirably etched. As a result, the gate insulating layer 10 has an undercut structure at peripheries of the first dummy pattern 21a.

In addition, the passivation layer 50, which is formed to cover the gate insulating layer 10 and the second auxiliary pattern 38, has an undercut structure due to the undercut structure of the gate insulating layer 10. Accordingly, the connection pattern 63 (e.g., the jumper portion), which is formed on the passivation layer 50 to connect the first and second auxiliary patterns 8 and 38, has a problem of disconnecting.

SUMMARY OF THE INVENTION

Accordingly, the present invention is directed to an array substrate and a method of fabricating the same that substantially obviate one or more of the problems due to limitations and disadvantages of the related art.

An object of the present invention is to provide an array substrate being capable of addressing disconnection problems related to a connection pattern in a GIP structure array substrate.

Another object of the present invention is to provide a method of fabricating the array substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the present invention can provide an array substrate including a gate line and a data line in a display region and crossing each other to define a pixel region; first and second auxiliary patterns in a non-display region; a gate insulating layer between the gate and data lines, and the first and second auxiliary patterns; a passivation layer on the data line and the second auxiliary pattern and including first and second contact holes respectively exposing the first and second auxiliary patterns; a planarization layer on the passivation layer and including first and second pack holes, which respectively correspond to the first and second contact holes; a bridge pattern between the first and second pack holes and overlapping the second auxiliary pattern; a pixel electrode on the planarization layer and in the pixel region; and a connection pattern on the bridge pattern and contacting the first and second auxiliary patterns.

In another aspect of the present invention, an embodiment of the present invention provides a method of fabricating an array substrate including forming a gate line in a display region and a first auxiliary pattern in a non-display region; forming a gate insulating layer on the gate line and the first auxiliary pattern; forming a data line in the display region and a second auxiliary pattern in the non-display region over the gate insulating layer, the data line crossing the gate line to define a pixel region; forming a passivation layer on the data line and the second auxiliary pattern and including first and second contact holes respectively exposing the first and second auxiliary patterns; forming a planarization layer and a bridge pattern on the passivation layer, wherein the planarization layer includes first and second pack holes, which respectively correspond to the first and second contact holes, and wherein the bridge pattern is positioned between the first and second pack holes and overlaps the second auxiliary pattern; and forming a pixel electrode on the planarization layer and in the pixel region, and a connection pattern on the bridge pattern, the connection pattern contacting the first and second auxiliary patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Reference will now be made in detail to the preferred embodiments of the present invention, examples of which are illustrated in the accompanying drawings.

Figure 1:
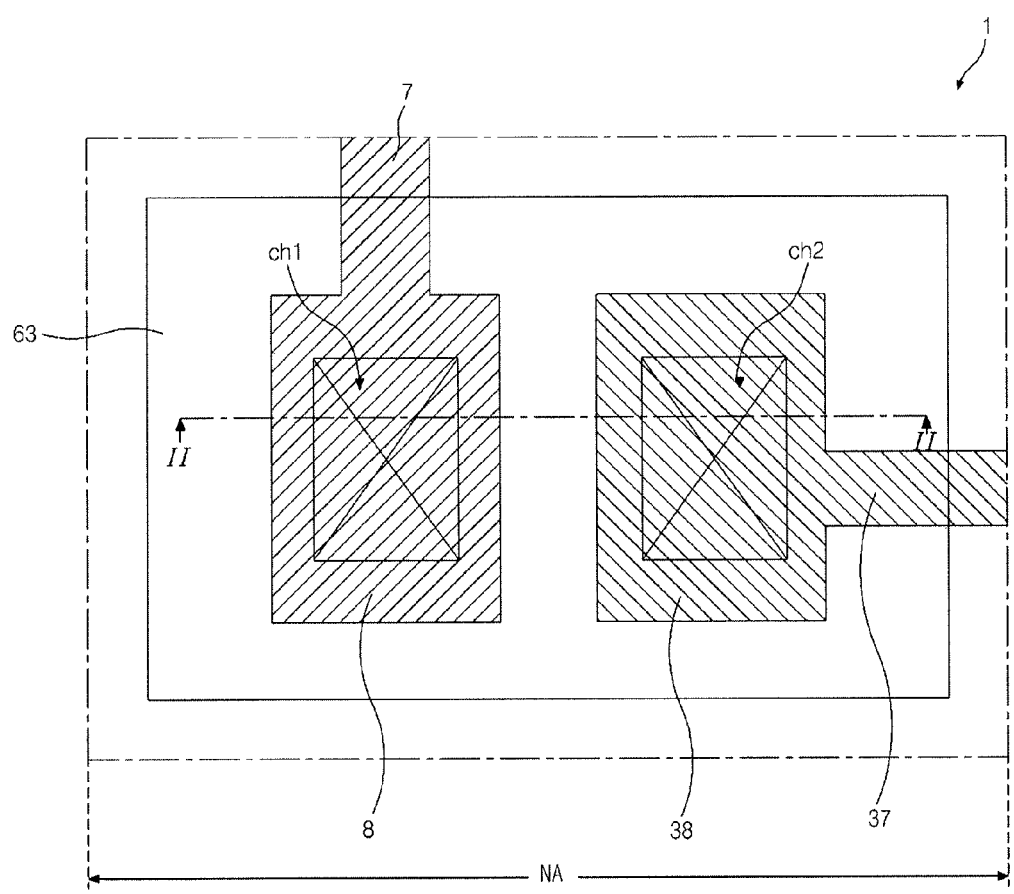
FIG. 1 is a schematic plane view of a non-display region of a related art GIP structure array substrate.
Figure 2:
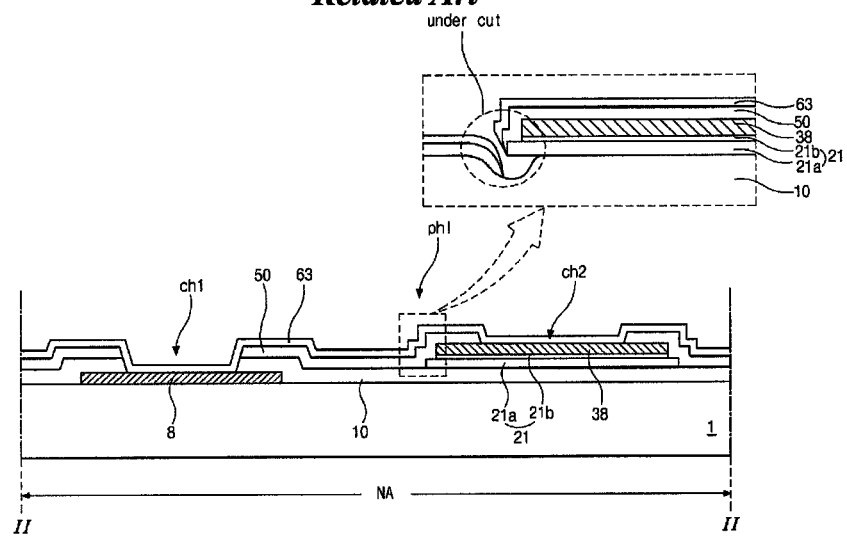
FIG. 2 is a cross-sectional view taken along II-II line of FIG. 1.
Figure 3:
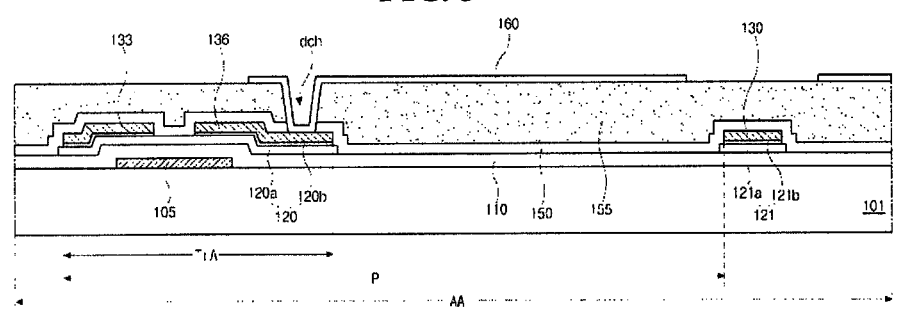
FIG. 3 is a schematic cross-sectional view of a display region of an array substrate according to a first embodiment of the present invention.
Figure 4:
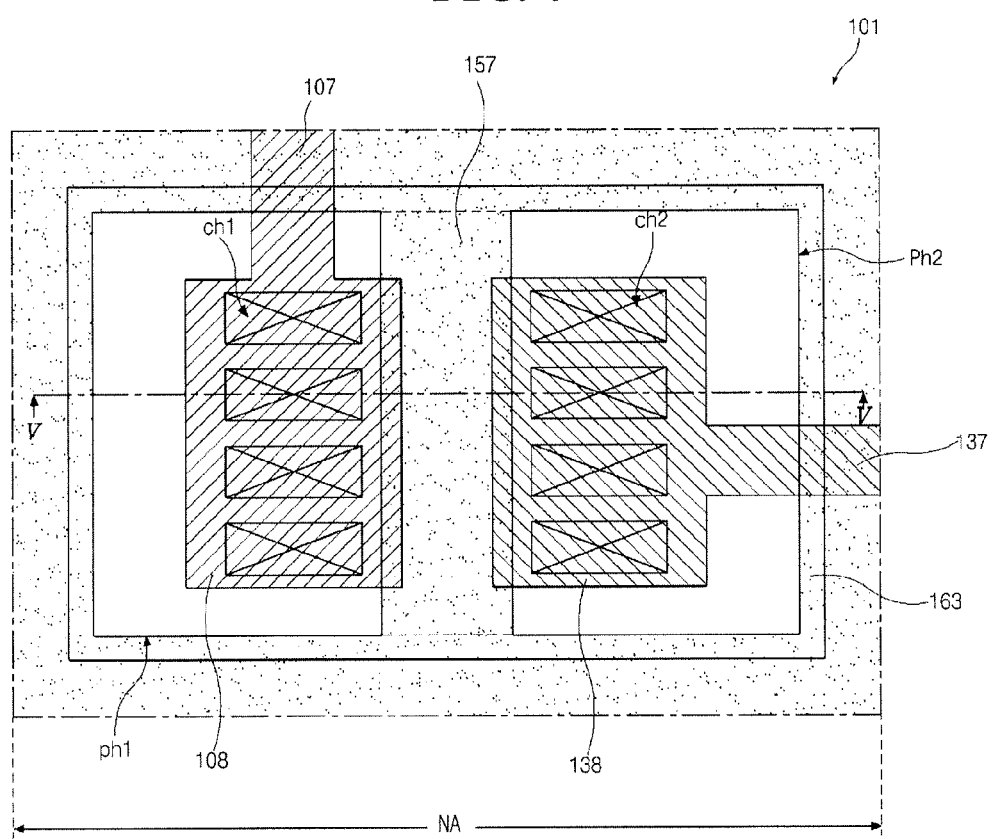
FIG. 4 is a schematic plane view of a non-display region of an array substrate according to a first embodiment of the present invention.
Figure 5:
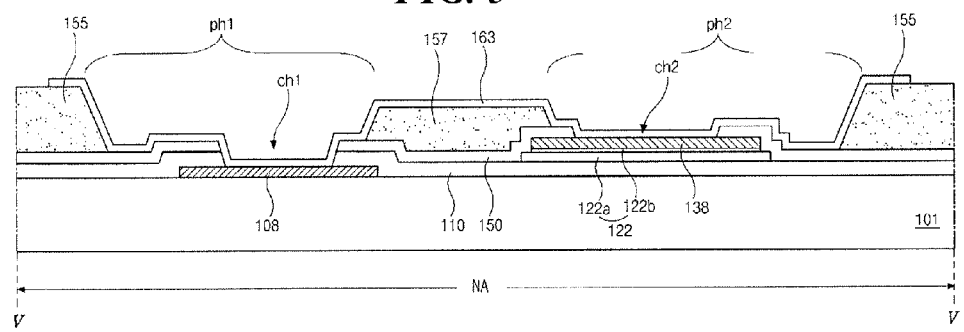
FIG. 5 is a cross-sectional view taken along V-V line of FIG. 4.
Figure 13:
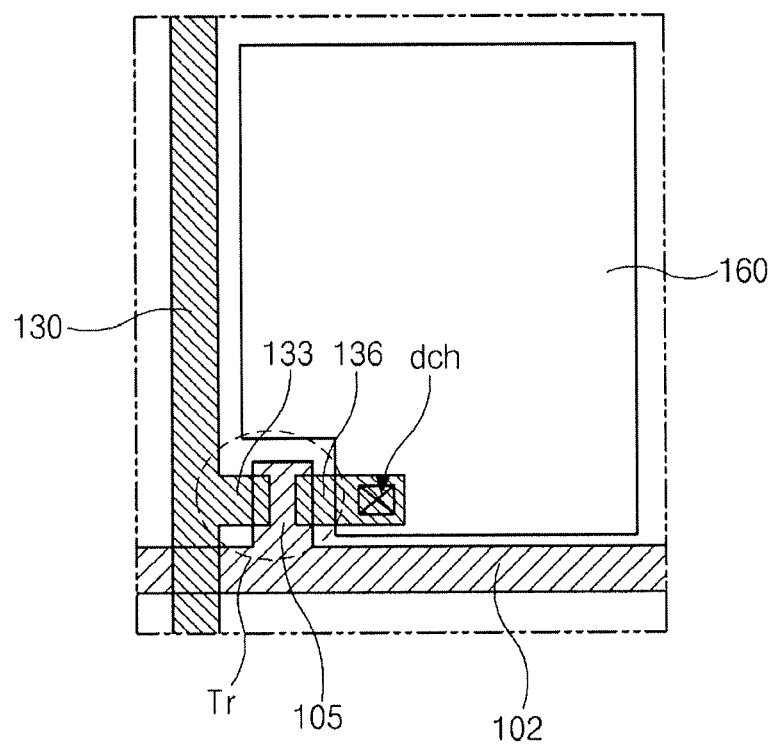
FIG. 13 is a schematic plane view of a display region of an array substrate according to a first embodiment of the present invention.

FIG. 3 is a schematic cross-sectional view of a display region of an array substrate according to a first embodiment of the present invention, and FIG. 4 is a schematic plane view of a non-display region of an array substrate according to a first embodiment of the present invention. FIG. 5 is a cross-sectional view taken along V-V line of FIG. 4. FIG. 13 is a schematic plane view of a display region of an array substrate according to a first embodiment of the present invention. For convenience of explanation, a region, where a thin film transistor (TFT) is formed, is defined as an element region TrA in a pixel region P.

As shown in FIGS. 3 to 5 and 13, a gate electrode 105 is formed on a substrate 101 and in an element region TrA. The gate electrode 105 has a single-layered structure of a first low resistance metallic material such as aluminum (Al), Al alloy (AlNd), copper (Cu), Cu alloy, molybdenum (Mo) or Mo-titanium alloy (MoTi). Alternatively, the gate electrode 105 may have a multi-layered structure comprising at least two of the first low resistance metallic materials.

Although not shown, a A gate line 102 is connected to the gate electrode 105. In a non-display region NA at an outer side of a display region AA, a gate pad electrode is formed in connection with the gate line 102.

In addition, in the non-display region NA, a plurality of first auxiliary lines 107 and a plurality of first auxiliary patterns 108 are formed of the same material and on the same layer as the gate line and the gate electrode 105.

In the GIP structure array substrate, the plurality of first auxiliary lines 107 and the plurality of first auxiliary patterns 108 are elements of a gate circuit part (not shown) and a signal input part (not shown) in the non-display region NA. A layer, where the gate line, the gate electrode 105, the first auxiliary lines 107 and the first auxiliary patterns 108 are disposed, is referred to as a gate layer.

A gate insulating layer 110, which is formed of an inorganic insulating material such as silicon oxide or silicon nitride, is formed on the gate line, the gate electrode 105, the first auxiliary lines 107 and the first auxiliary patterns 108.

Over the gate insulating layer 110, a data line 130, which crosses the gate line to define the pixel region P, is formed of a second low resistance metallic material such as aluminum (Al), Al alloy (AlNd), copper (Cu), Cu alloy, molybdenum (Mo) or Mo-titanium alloy (MoTi). The data line 130 has a single-layer structure. Alternatively, the data line 130 may have a multi-layered structure comprising at least two of the second low resistance metallic materials.

A semiconductor layer 120 including an active layer 120a of intrinsic amorphous silicon and an ohmic contact layer 120a of impurity-doped amorphous silicon is formed on the gate insulating layer 110. The semiconductor layer 120 is positioned in the element region TrA to correspond to the gate electrode 105. A source electrode 133 and a drain electrode 136 are formed on the semiconductor layer 120. The source electrode 133 is spaced apart from the drain electrode 136 and is connected to the data line 130.

In order to reduce production costs and simplify the fabrication process, the semiconductor layer 120, the source electrode 133 and the drain electrode 136 are formed by a single mask process. As a result, a first dummy semiconductor pattern 121, which includes a first dummy pattern 121a on the gate insulating layer 110 and a second dummy pattern 121b on the first dummy pattern 121a, is formed under the data line 130. The first dummy pattern 121a is formed of the same material as the active layer 120a, and the second dummy pattern 121b is formed of the same material as the ohmic contact layer 120b.

In the non-display region NA, a second auxiliary line 137 and a second auxiliary pattern 138 are formed over the gate insulating layer 110. The second auxiliary line 137 and the second auxiliary pattern 138 are formed of the same material and on the same layer as the data line 130.

Under the second auxiliary line 137 and the second auxiliary pattern 138, a second dummy semiconductor pattern 122, which includes a third dummy pattern 122a on the gate insulating layer 110 and a fourth dummy pattern 122b on the third dummy pattern 122a, is formed. The third dummy pattern 122a is formed of the same material as the active layer 120a, and the fourth dummy pattern 122b is formed of the same material as the ohmic contact layer 120b.

Although not shown, a data pad electrode, which is connected to an end of the data line 130, is formed. Under the data pad electrode, a third dummy semiconductor pattern, which includes fifth and sixth dummy patterns, is formed.

The gate electrode 105, the semiconductor layer 120, the source electrode 133 and the drain electrode 136 constitute the TFT Tr. The gate electrode 105 is connected to the gate line 102, and the source electrode 133 is connected to the data line 130. As a result, the TFT Tr is connected to the gate line 102 and the data line 130.

In each element region TrA, at least another TFT may be formed. The array substrate is used for the LCD device, there may be one TFT Tr in each element region TrA. Alternatively, the array substrate is used for the OLED display device, there may be at least two TFTs, which serve as a switching element and a driving element, in each element region TrA.

A passivation layer 150, which is formed of an inorganic insulating material such as silicon oxide or silicon nitride, is formed on the data line 130 and the TFT Tr, the second auxiliary line 137 and the second auxiliary pattern 138.

In addition, at least one first contact hole "ch1" exposing the first auxiliary pattern 108 is formed through the passivation layer 150 and the gate insulating layer 110, and at least one second contact hole "ch2" exposing the second auxiliary pattern 138 is formed through the passivation layer 150.

A planarization layer 155, which is formed of an organic insulating material such as photo-acryl and has a flat top surface, is formed on the passivation layer 150. A drain contact hole "dch" exposing the drain electrode 136 of the TFT Tr is formed through the planarization layer 155 and the passivation layer 150. In addition, a first pack hole "ph1", which corresponds to the first contact hole "ch1," has a larger size than the first contact hole "ch1," and a second pack hole "ph2", which corresponds to the second contact hole "ch2," has a larger size than the second contact hole "ch1," and both are formed through the planarization layer 155 in the non-display region NA.

A portion of the planarization layer 155, which is positioned between the first and second pack holes "ph1" and "ph2", is defined as a bridge pattern 157. One end of the bridge pattern 157 partially overlaps the second auxiliary pattern 138. Namely, one end of the bridge pattern 147 covers the passivation layer 150 corresponding to the second dummy pattern 122. In addition, the other end of the bridge pattern 157 may partially overlap the first auxiliary pattern 137.

The bridge pattern 157 is formed of organic insulating material and has a relatively large thickness. In this instance, the connection pattern 163, which is formed on the bridge pattern 157, may be disconnected at a side of the bridge pattern 157. The bridge pattern 157 has a thickness smaller than the planarization layer 155 to prevent disconnection problems in connection pattern 163. Alternatively, the bridge pattern 157 may have the same thickness as the planarization layer 155.

As mentioned above, when the semiconductor layer 120 and the source and drain electrodes 133 and 136 are formed by a single mask process, the gate insulating layer 110 may have an undercut structure at peripheries of the second dummy semiconductor pattern 122. In addition, the passivation layer 155 may also have the undercut structure. Without the bridge pattern 157, which is positioned between the first and second contact holes "ch1" and "ch2" and between the first and second auxiliary patterns 108 and 138 and covers the second dummy pattern 122, there is a disconnection problem in the connection pattern 163 because of the undercut structure of the passivation layer 150. Since the planarization layer 155 has a sufficient thickness, for example, 1.5 to 5 times than a thickness of the gate insulating layer 110 or the passivation layer 150, and is formed by a coating process, the undercut structure of the passivation layer 150 is filled with the planarization layer 155. In addition, due to the sufficient thickness, there is no undercut structure in the bridge pattern 157, and the bridge pattern 157 provides a substantially flat top surface. As a result, a disconnection problem in the connection pattern 163 is prevented.

The material of the planarization layer 155 and the bridge pattern 157 have a negative type photo-sensitive property such that a side surface of the planarization layer 155 and the bridge pattern 157 has a taper shape. The side surface is gently inclined with respect to a top surface of the passivation layer 150 or a top surface of the substrate 101. As a result, a pixel electrode 160 and the connection pattern 163, each of which is formed of a transparent conductive material and covers the side surface of the planarization layer 155 and the bridge pattern 157, a step coverage is improved such that there is no disconnection problem in the pixel electrode 160 and the connection pattern 163 at the side surface of the planarization layer 155 and the bridge pattern 157.

On the planarization layer 155 having the first and second pack holes "ph1" and "ph2," the pixel electrode 160 and the connection pattern 163 are formed in the pixel region P and the non-display region NA, respectively. Each of the pixel electrode 160 and the connection pattern 163 is formed of a transparent conductive material, e.g., indium-tin-oxide (ITO) or indium-zinc-oxide (IZO). The pixel electrode 160 contacts the drain electrode 136 of the TFT through the drain contact hole "dch." One end of the connection pattern 163 contacts the first auxiliary pattern 108 through the first contact hole "ch1" and the other end of the connection pattern 163 contacts the second auxiliary pattern 138 through the second contact hole "ch2." As a result, the first and second auxiliary patterns 108 and 138 are electrically connected to each other. The connection pattern 163 is positioned to correspond to the first and second pack holes "ph1" and "ph2" and the bridge pattern 157.

Since the periphery of the second auxiliary pattern 138, where the undercut structure may be generated, is covered by the bridge pattern 157, the disconnection problem in the connection pattern 163 is not generated such that the electrical connection between the first and second auxiliary patterns 108 and 138 is secured.

In addition, since the side surface of the bridge pattern 157 has a gentle slope with respect to the surface of the substrate 101 or the passivation layer 150, there is no disconnection problems in the connection pattern 163 at the side surface of the bridge pattern 157.

Figure 6:
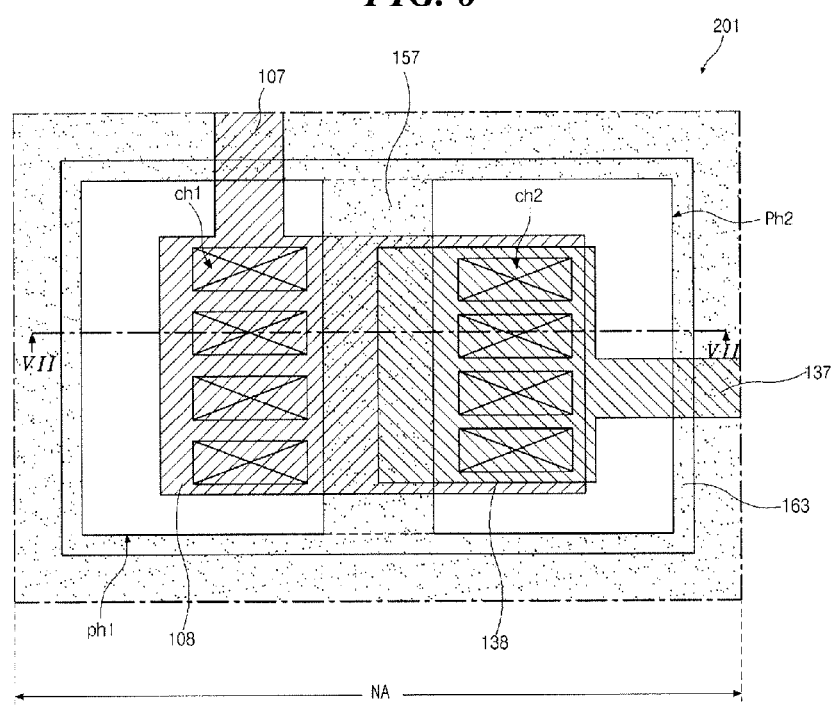
FIG. 6 is a schematic plane view of a non-display region of an array substrate according to a second embodiment of the present invention.
Figure 7:
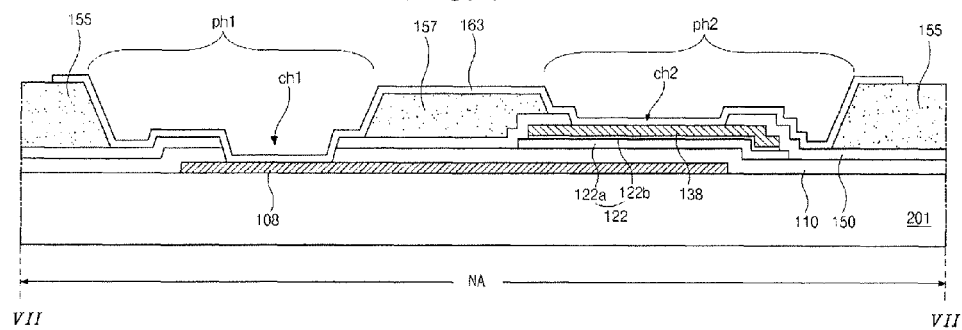
FIG. 7 is a cross-sectional view taken along VII-VII line of FIG. 6.

FIG. 6 is a schematic plane view of a non-display region of an array substrate according to a second embodiment of the present invention, and FIG. 7 is a cross-sectional view taken along VII-VII line of FIG. 6.

In the array substrate according to the second embodiment of the present invention, the second auxiliary pattern 138 over the substrate 201 partially overlaps the first auxiliary pattern 108 on the substrate 201. Alternatively, the second auxiliary pattern 138 may completely overlap the first auxiliary pattern 108.

As shown in FIGS. 6 and 7, the first auxiliary pattern 108 is formed on the substrate 201, and the gate insulating layer 110 is formed on the first auxiliary pattern 108. The second auxiliary pattern 138 is formed over the gate insulating layer 110 to partially overlap the first auxiliary pattern 108. As mentioned above, the second auxiliary pattern 138 may completely overlap the first auxiliary pattern 108. In addition, the second dummy semiconductor pattern 122, which includes the third and fourth dummy patterns 122a and 122b, is formed on the gate insulating layer 110 and under the second auxiliary pattern 138.

On the second auxiliary pattern 138, the passivation layer 150 is formed. At least one first contact hole "ch1," exposing the first auxiliary pattern 108, is formed through the passivation layer 150 and the gate insulating layer 110, and at least one second contact hole "ch2," exposing the second auxiliary pattern 138, is formed through the passivation layer 150.

The planarization layer 155, which is formed of an organic insulating material such as photo-acryl with a flat top surface, is formed on the passivation layer 150. The first pack hole "ph1" corresponds to the first contact hole "ch1" and has a larger size than the first contact hole "ch1," and the second pack hole "ph2" corresponds to the second contact hole "ch2" and has a larger size than the second contact hole "ch1," and both are formed through the planarization layer 155 in the non-display region NA.

A portion of the planarization layer 155, which is positioned between the first and second pack holes "ph1" and "ph2," is defined as the bridge pattern 157. One end of the bridge pattern 157 partially overlaps the second auxiliary pattern 138. Namely, one end of the bridge pattern 147 covers the passivation layer 150 corresponding to the second dummy pattern 122. In addition, the other end of the bridge pattern 157 may partially overlap the first auxiliary pattern 137.

The connection pattern 163 is formed on the bridge pattern 157 and in the first and second pack holes "ph1" and "ph2". One end of the connection pattern 163 contacts the first auxiliary pattern 108 through the first contact hole "ch1" and the other end of the connection pattern 163 contacts the second auxiliary pattern 138 through the second contact hole "ch2". As a result, the first and second auxiliary patterns 108 and 138 are electrically connected to each other.

The bridge pattern 157 is formed of the organic insulating material and has a relatively large thickness. In this instance, the connection pattern 163, which is formed on the bridge pattern 157, may be disconnected at a side of the bridge pattern 157. The bridge pattern 157 has a thickness smaller than the planarization layer 155 to prevent a disconnection problem in a connection pattern 163. Alternatively, the bridge pattern 157 may have the same thickness as the planarization layer 155.

Since the periphery of the second auxiliary pattern 138, where the undercut structure may be generated, is covered by the bridge pattern 157, disconnection problems in the connection pattern 163 are not generated and the electrical connection between the first and second auxiliary patterns 108 and 138 is made more secure.

In addition, since the side surface of the bridge pattern 157 has a gentle slope with respect to the surface of the substrate 201 or the passivation layer 150, there are no disconnection problems in the connection pattern 163 at the side surface of the bridge pattern 157.

The other elements in the array substrate have substantially the same structure as those in the array substrate according to the first embodiment such that the explanations for the other elements are omitted.

Figure 8:
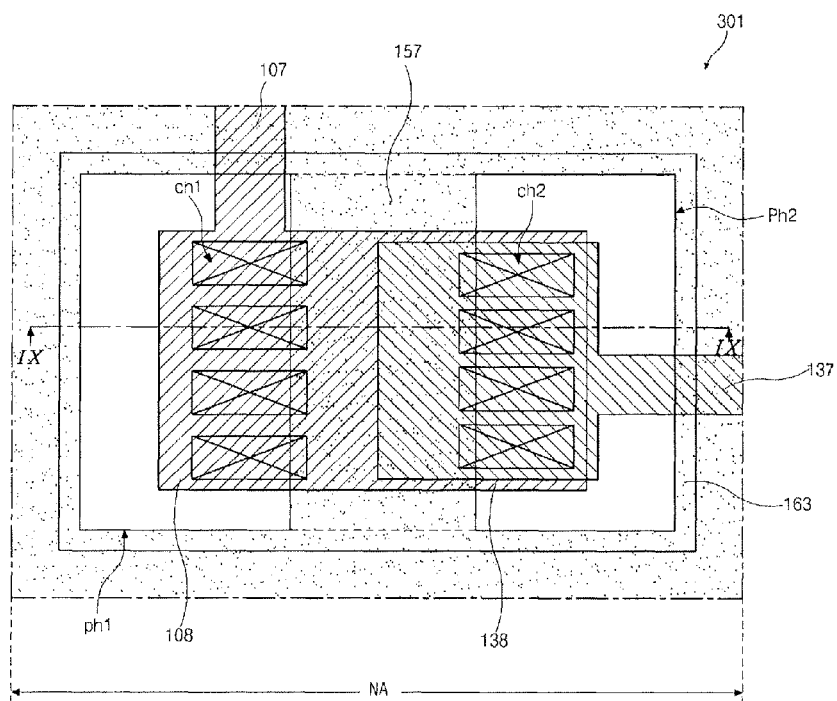
FIG. 8 is a schematic plane view of a non-display region of an array substrate according to a third embodiment of the present invention.
Figure 9:
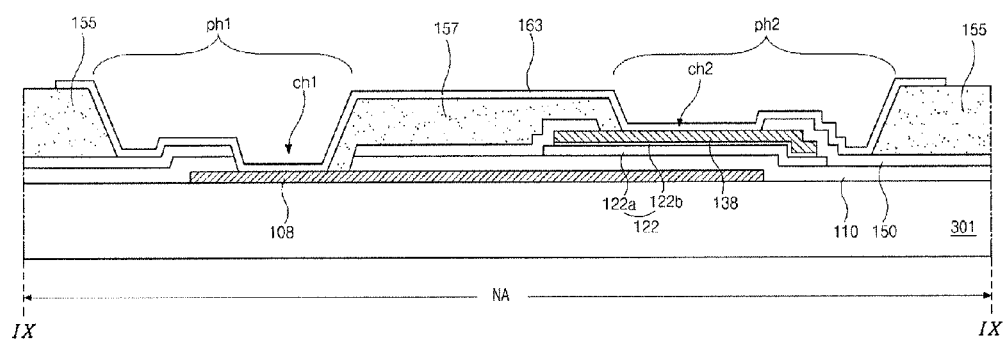
FIG. 9 is a cross-sectional view taken along IX-IX line of FIG. 8.

FIG. 8 is a schematic plane view of a non-display region of an array substrate according to a third embodiment of the present invention, and FIG. 9 is a cross-sectional view taken along IX-IX line of FIG. 8.

The array substrate of the third embodiment has a different position for the bridge pattern 157 than that of the second embodiment. According, the following discussion focuses on the bridge pattern 157.

As shown in FIGS. 8 and 9, in the array substrate of the third embodiment, the bridge pattern 157 partially overlaps the first and second auxiliary patterns 108 and 138. Namely, one end of the bridge pattern 108 overlaps the first auxiliary pattern 108, and the other end of the bridge pattern 138 overlaps the second auxiliary pattern 138.

In addition, the bridge pattern 157 partially overlaps the first and second contact holes "ch1" and "ch2." Namely, one end of the bridge pattern 108 is positioned in the first contact hole "ch1," and the other end of the bridge pattern 138 is positioned in the second contact hole "ch2." In more detail, a side surface of the passivation layer 150 and the gate insulating layer 110 in the first contact hole "ch1" is covered by the bridge pattern 157, and a side surface of the passivation layer 150 in the second contact hole "ch2" is covered by the bridge pattern 157.

Since the bridge pattern 157 partially overlaps the first and second auxiliary patterns 108 and 138, the first and second auxiliary patterns 108 and 138 are stilled exposed through the first and second contact holes "ch1" and "ch2," respectively.

The side surface of the passivation layer 150 has a rapid slope or a reverse-taper shape with respect to the surface of the substrate 301 by the process of forming the first and second contact holes "ch1" and "ch2". When the bridge pattern 157 directly covers the side surface of the passivation layer 150 in the first and second contact holes "ch1" and "ch2", there may be the disconnection problem in the bridge pattern 157.

The side surface of the bridge pattern 157 has a much gentler slope with respect to the surface of the substrate 301 than that of the passivation layer 150. Accordingly, when the bridge pattern 157 covers the side surface of the passivation layer 150 in the first and second contact holes "ch1" and "ch2," a step coverage is improved such that disconnection problems with the bridge pattern 157 in the first and second contact holes "ch1" and "ch2" are further prevented.

The positional relationship between the bridge pattern 157 and the passivation layer 150 can be applicable to the array substrate of the first embodiment.

FIGS. 10A to 10K are cross-sectional views showing a fabrication process for a display region of an array substrate according to the first embodiment of the present invention, and FIGS. 11A to 11E are plane views showing a fabrication process for a non-display region of an array substrate according to the first embodiment of the present invention. FIGS. 12A to 12K are cross-sectional views showing a fabricating process of a non-display region of an array substrate according to the first embodiment of the present invention.

Figure 10A:
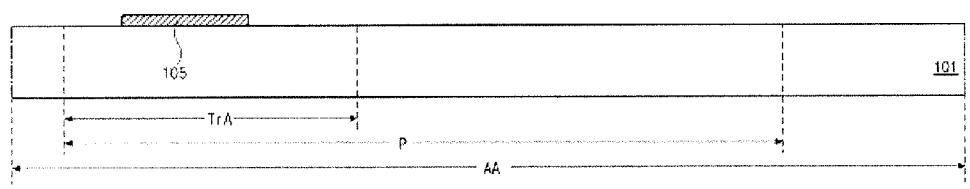
FIGS. 10A to 10K are cross-sectional views showing a fabricating process of a display region of an array substrate according to the first embodiment of the present invention.
Figure 11A:
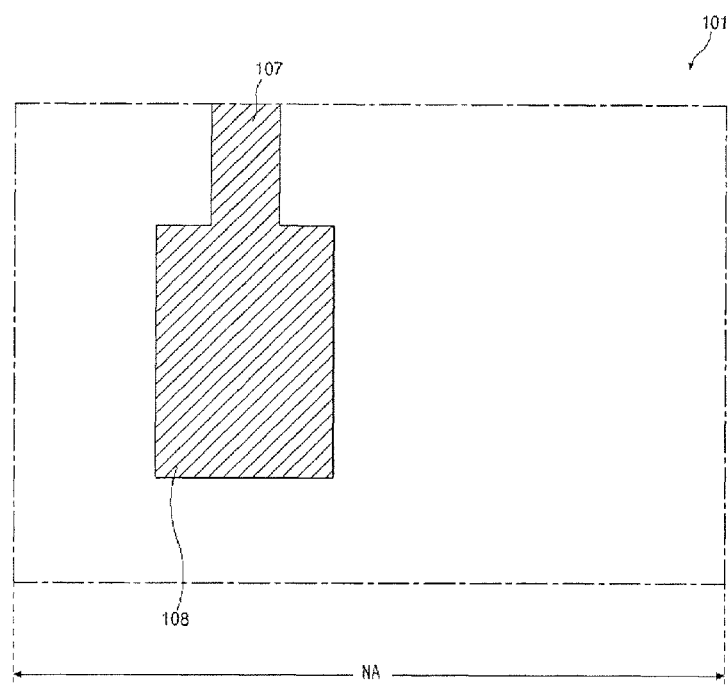
FIGS. 11A to 11E are plane views showing a fabricating process of a non-display region of an array substrate according to the first embodiment of the present invention.
Figure 12A:
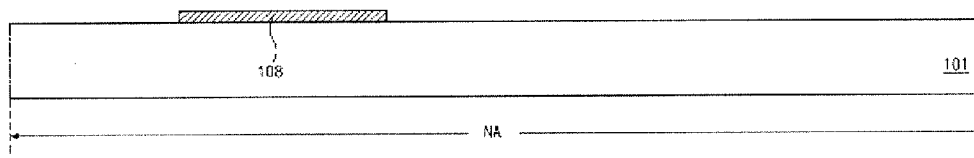
FIGS. 12A to 12K are cross-sectional views showing a fabricating process of a non-display region of an array substrate according to the first embodiment of the present invention.

As shown in FIGS. 10A, 11A and 12A, a first metal layer (not shown) is formed on the substrate 101 of glass or plastic by depositing one or more low resistance metallic materials such as aluminum (Al), Al alloy (AlNd), copper (Cu), Cu alloy, molybdenum (Mo) or Mo-titanium alloy (MoTi). The first metal layer may have a single-layer structure or may have a multi-layered structure.

A mask process, which includes a step of coating photoresist (PR) material, a step of exposing the PR material using an exposing mask, a step of developing the exposed PR material to form a PR pattern, a step of etching the first metal layer using the PR pattern using an etching mask, and a step of stripping the PR pattern, is performed on the first metal layer to form the gate line (not shown), the gate electrode 105, the first auxiliary line 107 and the first auxiliary pattern 108 on the substrate 301.

Figure 10B:
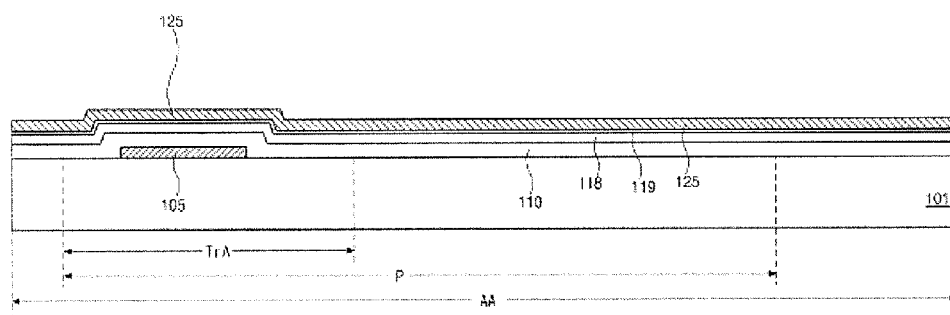
Figure 11B:
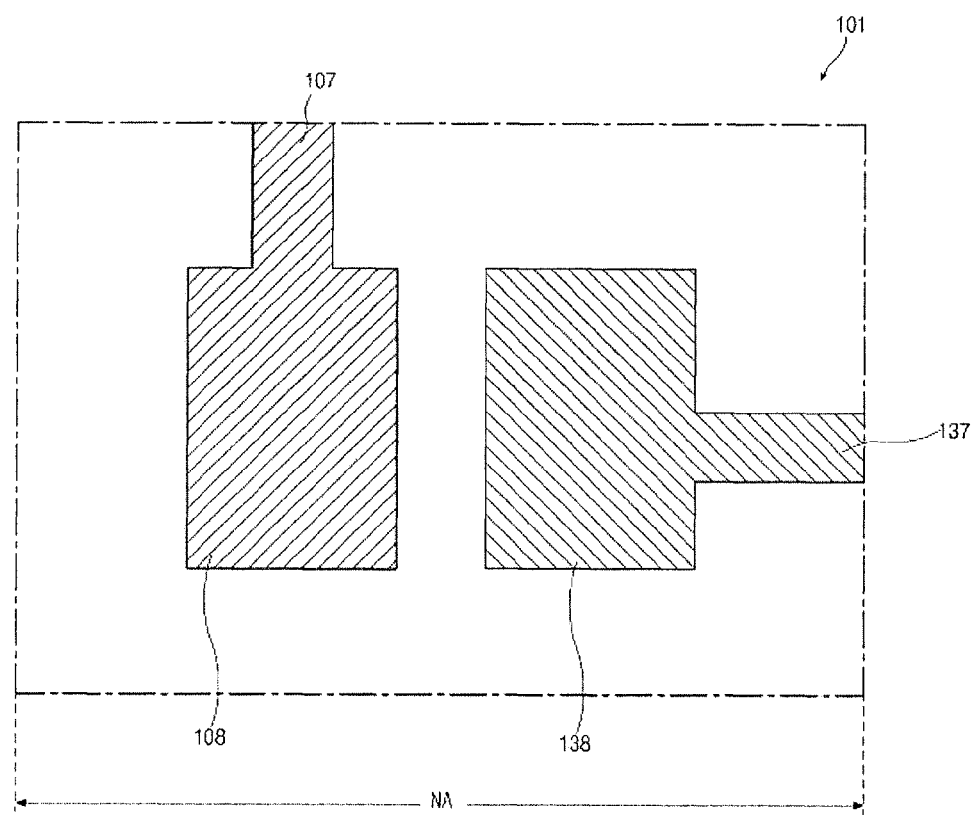
Figure 12B:
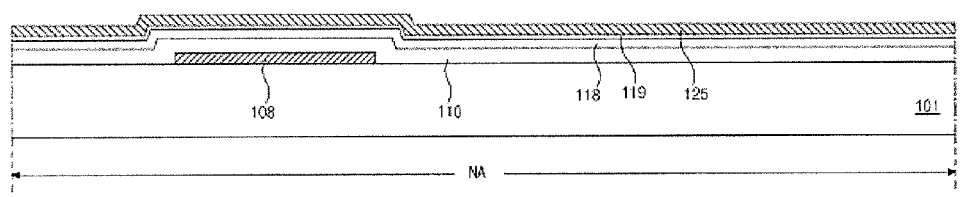

Next, as shown in FIGS. 10B, 11B and 12B, the gate insulating layer 110 is formed on the gate line, the gate electrode 105, the first auxiliary lines 107 and the first auxiliary patterns 108 by depositing an inorganic insulating material such as silicon oxide or silicon nitride. Sequentially, an intrinsic amorphous silicon layer 118, an impurity-doped amorphous silicon layer 119 and a second metal layer 125 are formed on the gate insulating layer 110 by sequentially depositing intrinsic amorphous silicon, impurity-doped amorphous silicon and a metal layer.

Figure 10C:
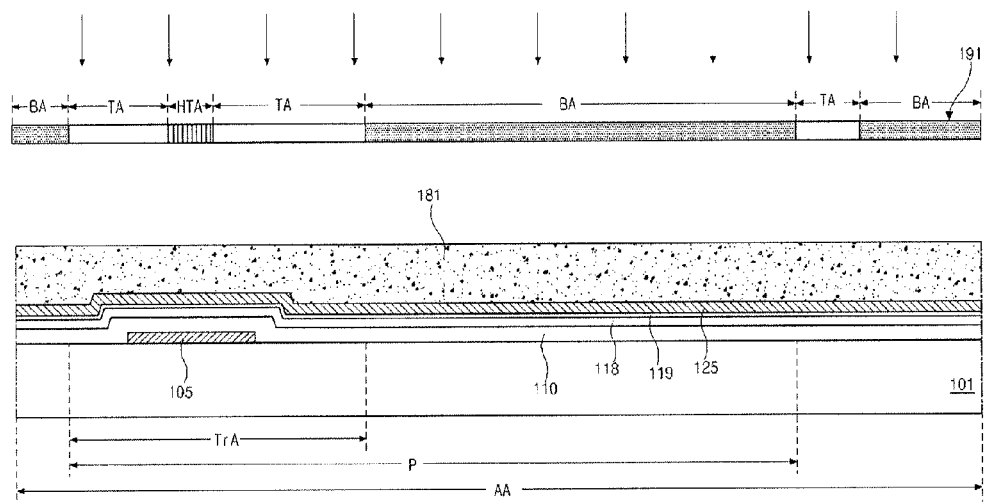
Figure 12C:
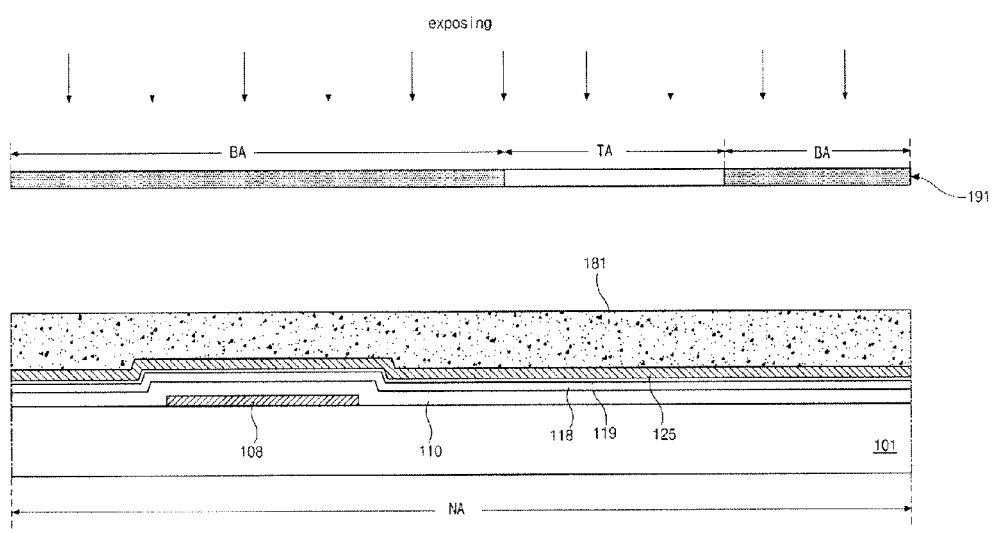

Next, as shown in FIGS. 10C, 11B and 12C, a PR layer 181 is formed on the second metal layer 125 by coating a PR material. An exposing mask 191, which includes a transmitting portion TA, a blocking portion BA and a half-transmitting portion HTA, is disposed over the PR layer 181. The half-transmitting portion HTA has a light transmittance being less than the transmitting portion TA and being greater than the blocking portion BA. An exposing process is performed onto the PR layer using the exposing mask 191.

When the PR layer 181 is a negative type, the transmitting portion TA corresponds to portions where the data line 130, the source electrode 133, the drain electrode 136, the second auxiliary line 137 and the second auxiliary pattern 138 will be formed. The half-transmitting portion HTA corresponds to a space between the source and drain electrodes 133 and 136. The blocking portion BA corresponds to the other portions.

Alternatively, When the PR layer 181 is a positive type, a position of the transmitting portion TA is changed with a position of the blocking portion BA.

Figure 10D:
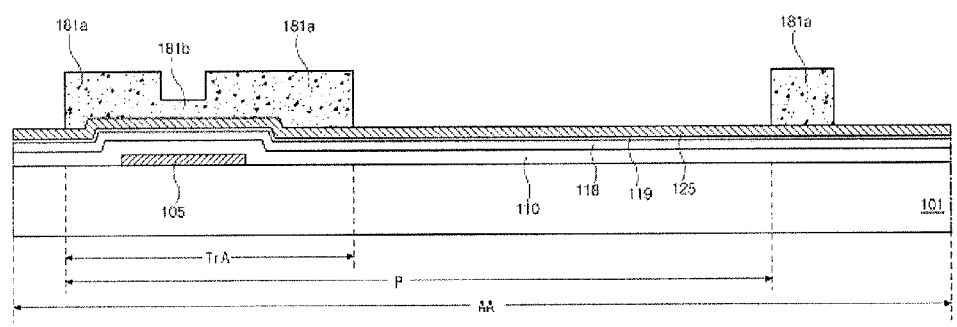
Figure 12D:
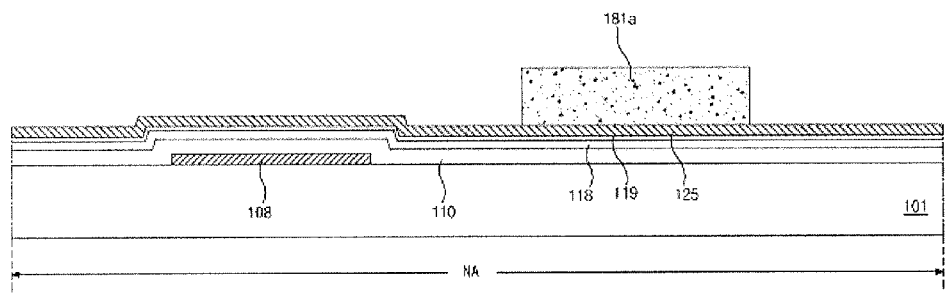

Next, as shown in FIGS. 10D, 11B and 12D, after the exposing process, a developing process is performed onto the PR layer 181 (of FIGS. 10C and 12C) such that a first PR pattern 181a having a first thickness and a second PR pattern 181b having a second thickness smaller than the first thickness are formed from the PR layer 181. The first PR pattern 181a corresponds to the transmitting portion TA, and the second PR pattern 181b corresponds to the half-transmitting portion HTA. The PR layer corresponding to the blocking portion BA is completely removed by the developing process such that the second metal layer 125 is exposed.

Figure 10E:
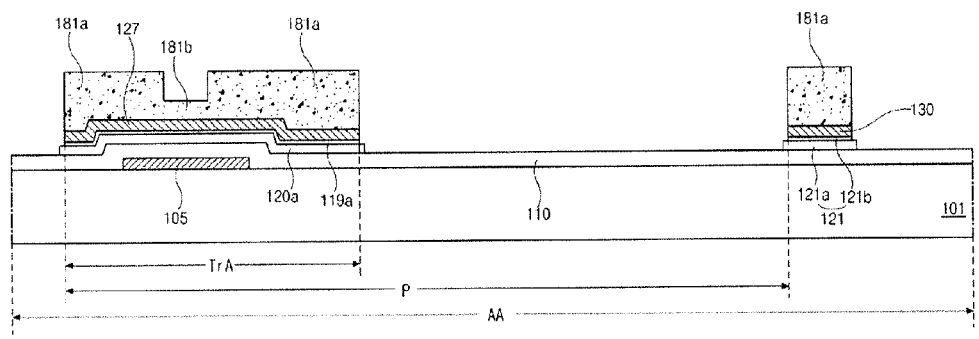
Figure 12E:
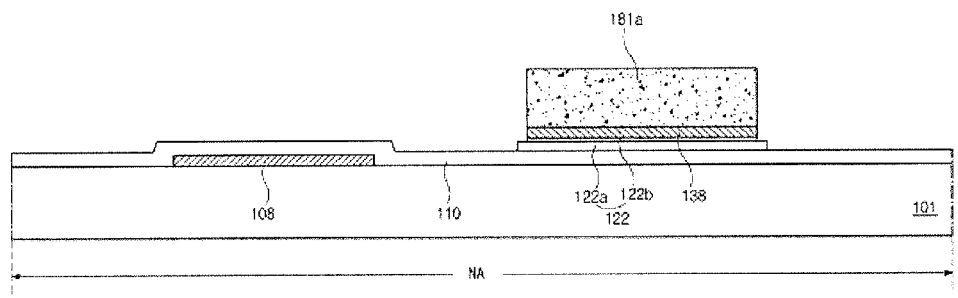

Next, as shown in FIGS. 10E, 11B and 12E, the second metal layer 125 (of FIGS. 10D and 12D), the impurity-doped amorphous silicon layer 119 (of FIGS. 10D and 12D) and the intrinsic amorphous silicon layer 118 (of FIGS. 10D and 12D) are etched using the first and second PR patterns 181a and 181b to form the data line 130, the source-drain pattern 127, the second auxiliary line 137 and the second auxiliary pattern 138 over the gate insulating layer 110, the active layer 120a on the gate insulating layer 110 and an impurity-doped amorphous silicon pattern 119a on the active layer 120a. The data line 130 crosses the gate line to define the pixel region P and is connected to the source-drain pattern 127. The second auxiliary line 137 and the second auxiliary pattern 138 are positioned in the non-display region NA.

In addition, the first dummy semiconductor pattern 121, which includes the first dummy pattern 121a on the gate insulating layer 110 and the second dummy pattern 121b on the first dummy pattern 121a, is formed under the data line 130, and the second dummy semiconductor pattern 122, which includes the third dummy pattern 122a on the gate insulating layer 110 and the fourth dummy pattern 122b on the third dummy pattern 122a, is formed under the second auxiliary line 137 and the second auxiliary pattern 138.

Figure 10F:
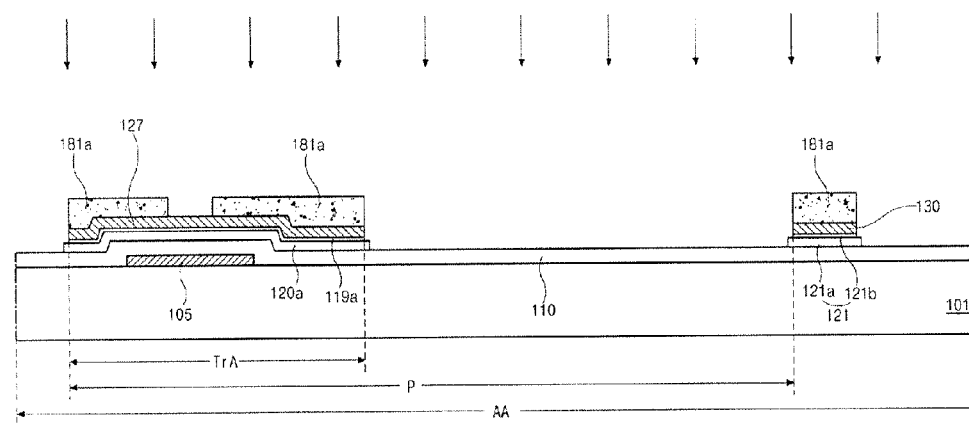
Figure 11C:
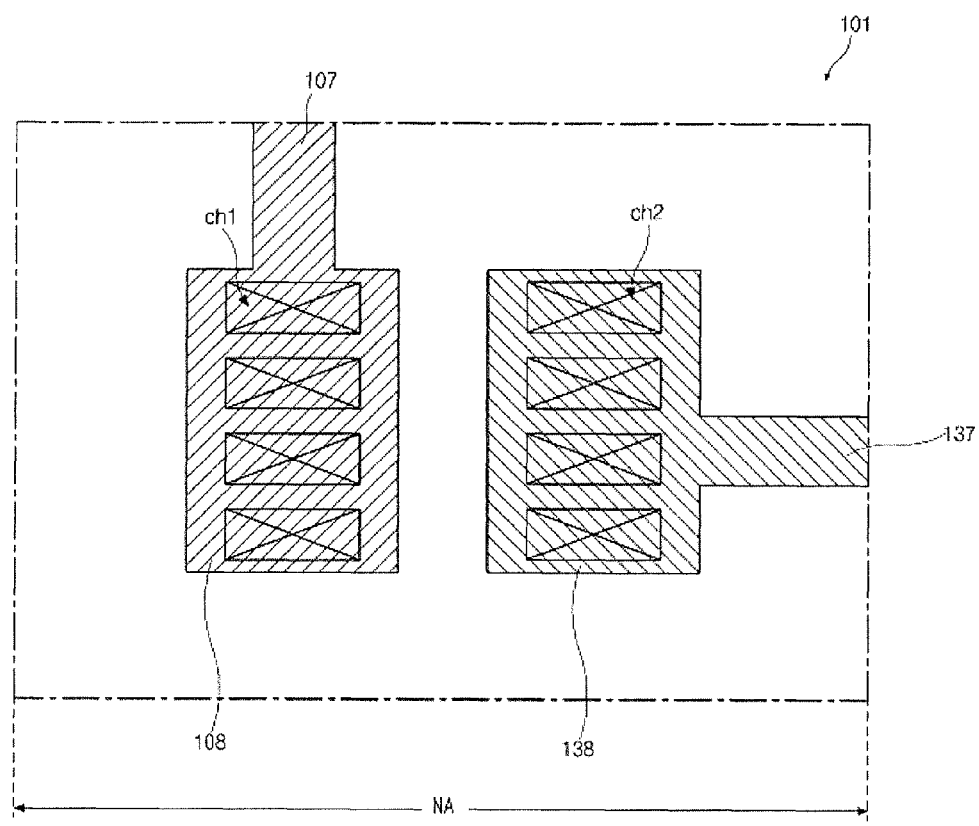
Figure 12F:
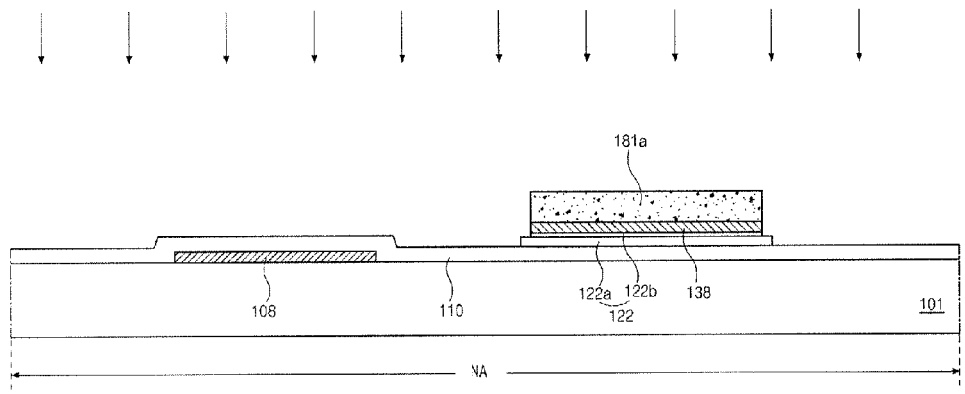

Next, as shown in FIGS. 10F, 11C and 12F, an aching process is performed onto the first PR pattern 181a (of FIGS. 10E and 12E) and the second PR pattern 181b (of FIG. 10E) such that a thickness of the first PR pattern 181a is reduced. In addition, the second PR pattern 181b is removed such that a center of the source-drain pattern 127 is exposed.

Figure 10G:
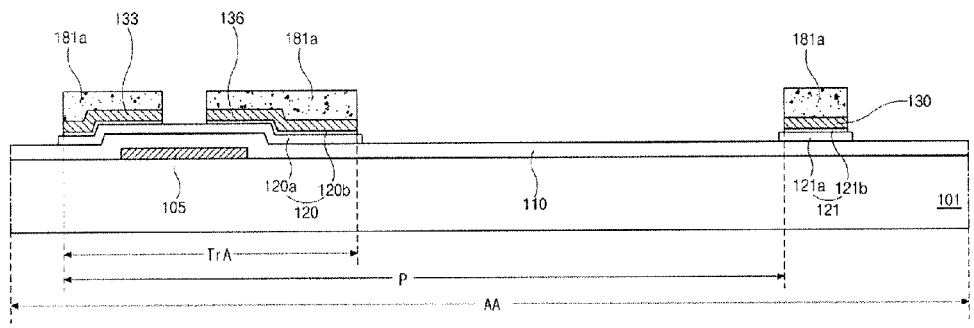
Figure 11D:
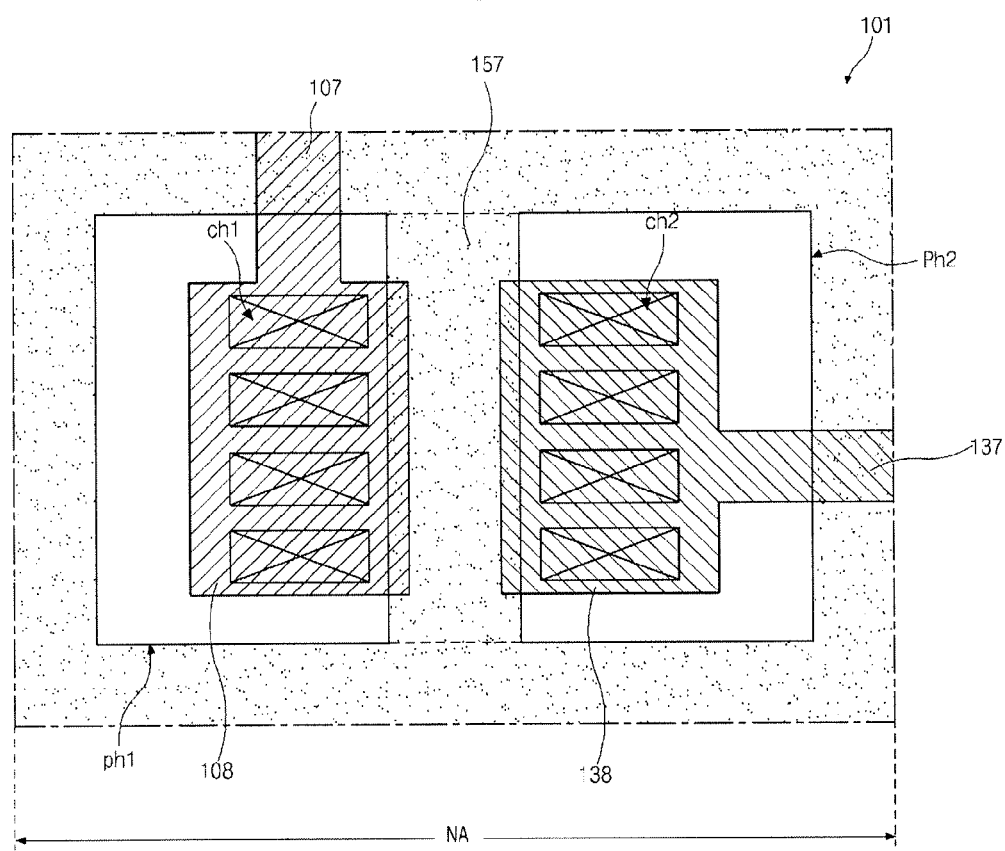
Figure 12G:
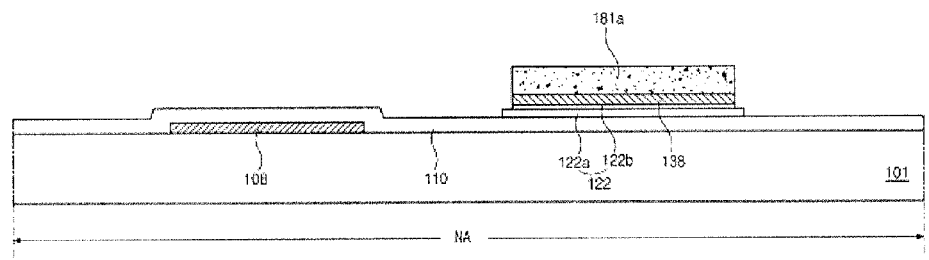

Next, as shown in FIGS. 10G, 11D and 12G, the center of the source-drain pattern 127 and a center of the impurity-doped amorphous silicon pattern 119a are etched to form the source electrode 133, the drain electrode 136 and the ohmic contact layer 120b. As a result, a center of the active layer 120a is exposed and serves as a channel of the TFT.

The gate electrode 105, the semiconductor layer 120, the source electrode 133 and the drain electrode 136 constitute the TFT Tr in the element region TrA.

In the GIP structure array substrate, a gate circuit part (not shown) and a signal input part (not shown) are formed in the non-display region NA. The gate circuit part is connected to each gate line and includes a driving block, and a plurality of driving TFTs, which are connected to each other, and formed in the driving block. The driving TFTs in the gate circuit part are fabricated by the same process as the TFT in the element region TrA of the display region AA.

The first dummy pattern 121a protrudes beyond the data line 130, and the third dummy pattern 122a protrudes beyond the second auxiliary line 137 and the second auxiliary pattern 138. It may be referred to as an active tail. The active tail is generated because the source and drain electrodes 133 and 136 are formed with the active layer 120a and the ohmic contact layer 120b by a single mask process.

In the above mask process, a portion of the gate insulating layer 110 is exposed to a dry-etching gas used for removing the center of the impurity-doped amorphous silicon pattern 119a (of FIG. 10F). In the peripheries of the active tail, the dry-etching gas strongly affects the gate insulating layer 110 such that the gate insulating layer 110 may have the undercut structure in the peripheries of the active tail.

On the other hand, FIGS. 10G, 11B and 12G show the second auxiliary pattern 138 being spaced apart from the first auxiliary pattern 108. Alternatively, in the second and third embodiments, the second auxiliary pattern 138 partially or completely overlaps the first auxiliary pattern 108.

When the second auxiliary pattern 138 completely overlaps the first auxiliary pattern 108, an area of the first auxiliary pattern 108 is larger than the second auxiliary pattern 138 such that one end of the first auxiliary pattern 108 protrudes beyond the second auxiliary pattern 138.

Figure 10H:
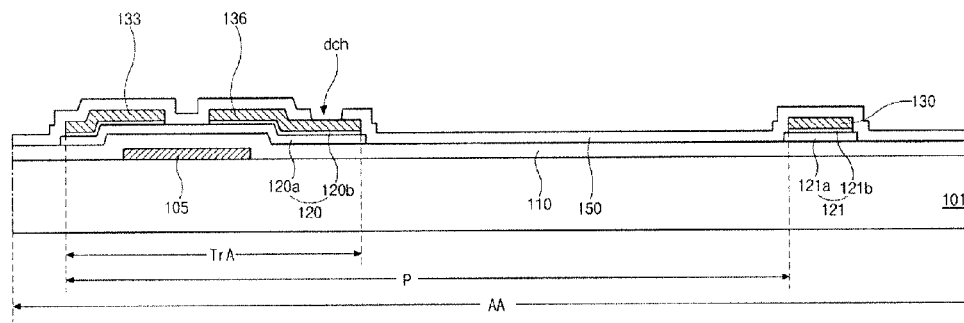
Figure 12H:
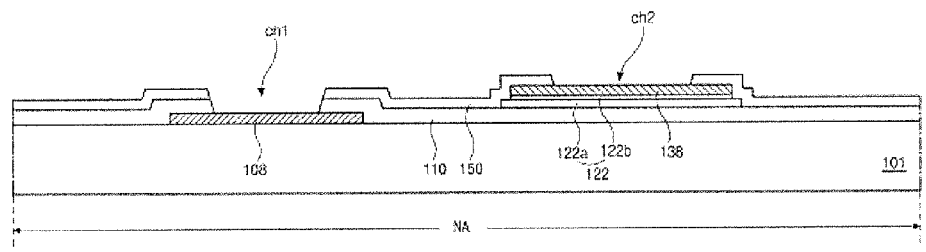

Next, as shown in FIGS. 10H, 11C and 12H, the first PR pattern 181a (of FIGS. 10G and 12G) is removed by an ashing process.

Next, the passivation layer 150 is formed on the data line 130, the source electrode 133, the drain electrode 136, the second auxiliary line 137 and the second auxiliary pattern 138 by depositing an inorganic insulating material such as silicon oxide or silicon nitride.

The passivation layer 150 is patterned by a mask process to form the drain contact hole "dch" exposing the drain electrode 136 and the second contact hole "ch2" exposing the second auxiliary pattern 138. In addition, the passivation layer 150 and the gate insulating layer 110 are patterned to form the first contact hole "ch1" exposing the first auxiliary pattern 108.

In FIG. 11C, four first contact holes "ch1" are formed to correspond to the first auxiliary pattern 108, and four second contact holes "ch2" are formed to correspond to the second auxiliary pattern 138.

Figure 10I:
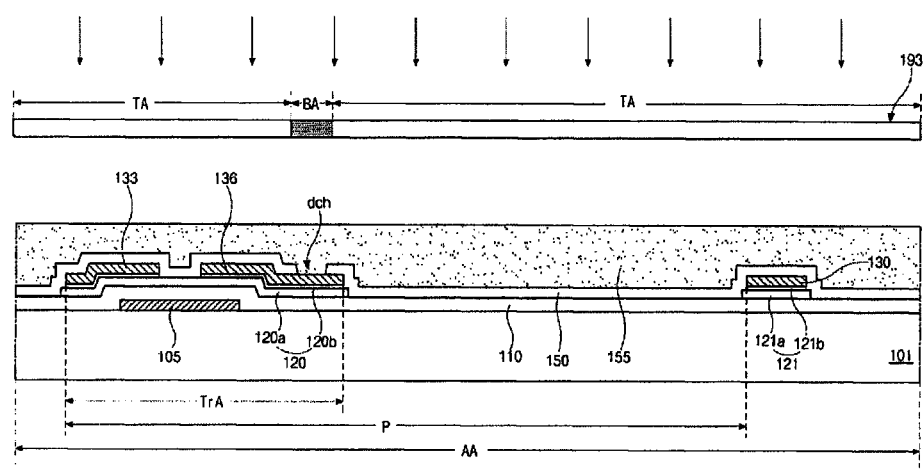
Figure 12I:
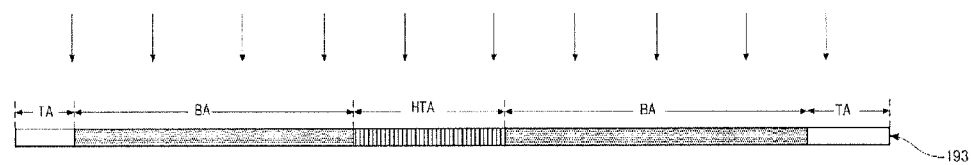
Figure 12I:
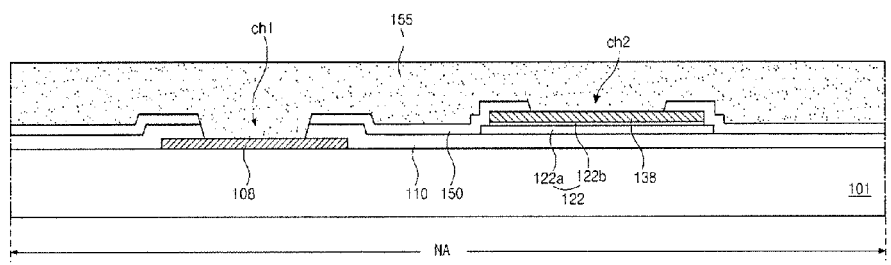

Next, as shown in FIGS. 10I, 11D and 12I, the planarization layer 155 is formed on the passivation layer 150, which includes the drain contact hole "dch" and the first and second contact holes "ch1" and "ch2," by coating a negative type photosensitive organic insulating material, e.g., photo-acryl.

An exposing mask 193, which includes a transmitting portion TA, a blocking portion BA and a half-transmitting portion HTA, is disposed over the planarization layer 155, and an exposing process is performed on the planarization layer 155.

The transmitting portion TA corresponds to a portion where the planarization layer 155 should remain, and the half-transmitting portion HTA corresponds to a portion where the bridge pattern 157 is formed. Namely, the half-transmitting portion HTA corresponds to a space between the first and second auxiliary patterns 108 and 138, a portion of the first auxiliary pattern 108 and a portion of the second auxiliary pattern 138. The blocking portion BA corresponds to a portion where the planarization layer 155 should be removed. Namely, the blocking portion BA corresponds to the drain electrode 136, the other portion of the first auxiliary pattern 108 and the other portion of the second auxiliary pattern 138.

In the second and third embodiments, since there is no space between the first and second auxiliary patterns 108 and 138, the half-transmitting portion HTA corresponds to the overlapped portion of the first and second auxiliary patterns 108 and 138.

In the first to third embodiments, the half-transmitting portion HTA corresponds to the active tail in the second auxiliary pattern 138.

In addition, in the third embodiment, the half-transmitting portion HTA corresponds to portions of the first and second contact holes "ch1" and "ch2."

Figure 10J:
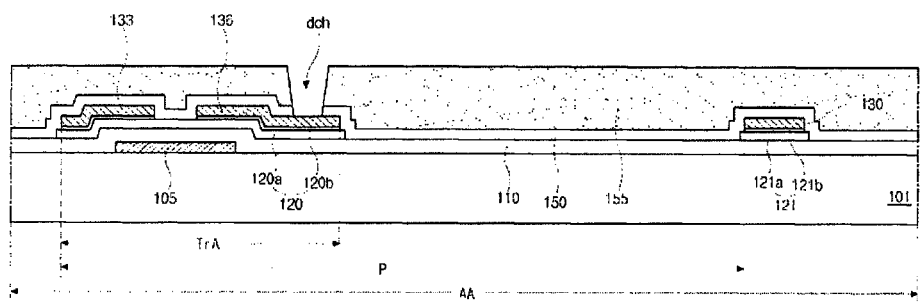
Figure 12J:
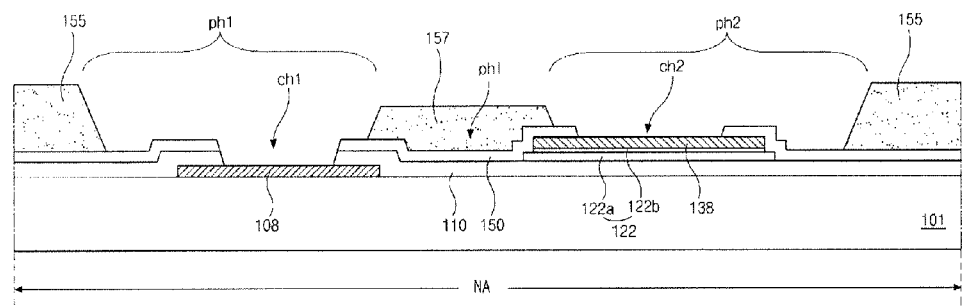

Next, as shown in FIGS. 10J, 11D, 12J, the exposed planarization layer 155 is developed such that a non-exposed portion of the planarization layer 155 is removed. As a result, the drain contact hole "dch" extends through the planarization layer 155. In addition, the first pack hole "ph1", which corresponds to the first contact hole "ch1," has a larger size than the first contact hole "ch1," and the second pack hole "ph2," which corresponds to the second contact hole "ch2," has a larger size than the second contact hole "ch1," and both are formed through the planarization layer 155 in the non-display region NA.

A portion of the planarization layer 155, which is positioned between the first and second pack holes "ph1" and "ph2," is defined as the bridge pattern 157. The bridge pattern 157 is positioned at a space between the first and second auxiliary patterns 108 and 138 and has a bar shape. The side surface of the bridge pattern 157 has a tapered shape with respect to the surface of the substrate 101 or the passivation layer 150.

The bridge pattern 157 has a height from the passivation layer or a thickness being smaller than the planarization layer 155.

The bridge pattern 157 covers the active tail in the second auxiliary pattern 138, and the undercut structure of the passivation layer 150 and the gate insulating layer 110 is filled with the planarization layer 155.

On the other hand, by using an exposing mask without the half-transmitting portion HTA, the bridge pattern 157 may have substantially the same thickness as the planarization layer 155.

In the third embodiment, the bridge pattern 157 is formed in portions of the first and second contact holes "ch1" and "ch2" respectively exposing the first and second auxiliary patterns 108 and 138. In this instance, the side surface of the passivation layer 150 in the first and second contact holes "ch1" and "ch2" is covered by the bridge pattern 157.

Figure 10K:
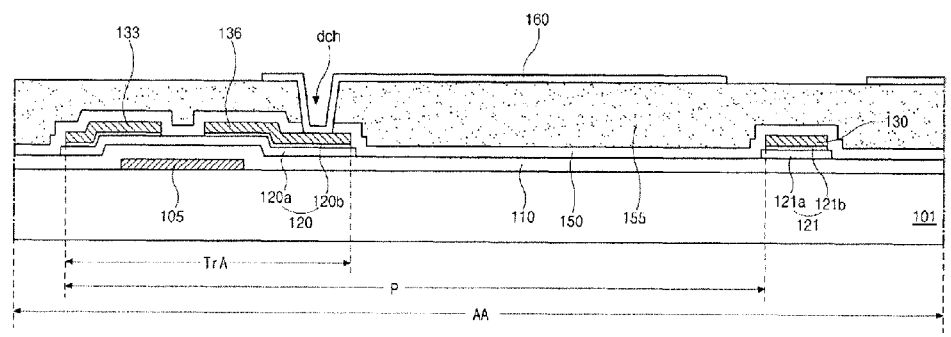
Figure 11E:
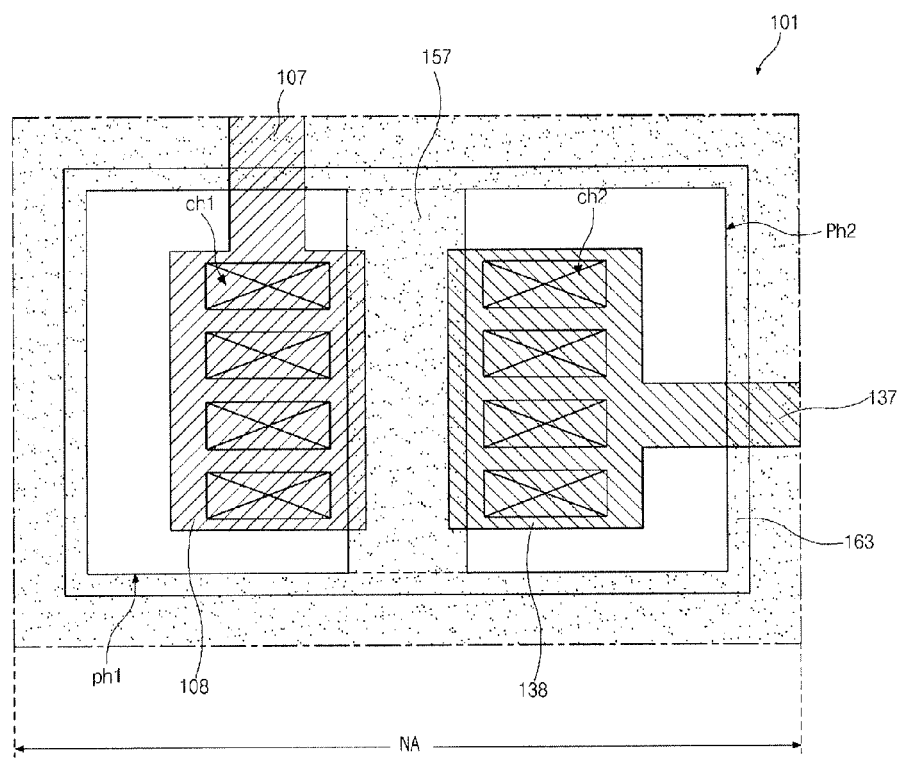
Figure 12K:
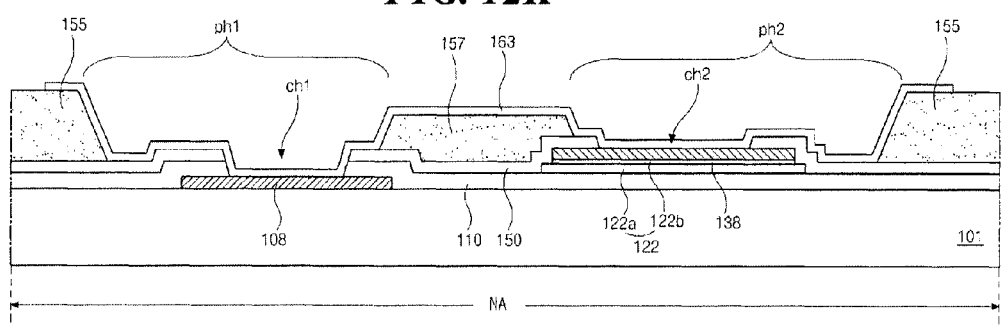

Next, as shown in FIGS. 10K, 11E and 12K, a transparent conductive material layer (not shown) is formed on the planarization layer 155 and the bridge pattern 157 by depositing a transparent conductive material such as ITO or IZO. The transparent conductive material layer is patterned by a mask process to form the pixel electrode 160 and the connection pattern 163. The pixel electrode 160 contacts the drain electrode 136 of the TFT through the drain contact hole "dch." One end of the connection pattern 163 contacts the first auxiliary pattern 108 through the first contact hole "ch1" and the other end of the connection pattern 163 contacts the second auxiliary pattern 138 through the second contact hole "ch2." As a result, the first and second auxiliary patterns 108 and 138 are electrically connected to each other. The connection pattern 163 is positioned to correspond to the first and second pack holes "ph1" and "ph2," and the bridge pattern 157.

Since the periphery of the second auxiliary pattern 138, where the undercut structure may be generated, is covered by the bridge pattern 157, disconnection problems in the connection pattern 163 are not generated such that the electrical connection between the first and second auxiliary patterns 108 and 138 is made more secure.

In addition, since the side surface of the bridge pattern 157 has a gentle slope with respect to the surface of the substrate 101 or the passivation layer 150, there is no disconnection problem in the connection pattern 163 at the side surface of the bridge pattern 157.

It will be apparent to those skilled in the art that various modifications and variations can be made in the present invention without departing from the spirit or scope of the invention. Thus, it is intended that the present invention covers modifications and variations of this invention provided they come within the scope of the appended claims and their equivalents.

What is claimed is:

1. A method of fabricating an array substrate, comprising:
   forming a gate line in a display region and a first auxiliary pattern in a non-display region;
   forming a gate insulating layer on the gate line and the first auxiliary pattern;
   forming a data line in the display region and a second auxiliary pattern in the non-display region over the gate insulating layer, wherein the data line crosses the gate line to define a pixel region;
   forming a passivation layer on the data line and the second auxiliary pattern, and the passivation layer including first and second contact holes respectively exposing the first and second auxiliary patterns;
   forming a planarization layer and a bridge pattern on the passivation layer, wherein the planarization layer includes first and second pack holes, which respectively correspond to the first and second contact holes, and wherein the bridge pattern is positioned between the first and second pack holes and overlaps the second auxiliary pattern; and
   forming a pixel electrode on the planarization layer and in the pixel region, and a connection pattern on the bridge pattern, wherein the connection pattern contacts the first and second auxiliary patterns,
   wherein the first and second pack holes expose an upper surface of the passivation layer and upper surfaces of the first and second auxiliary patterns.

2. The method according to claim 1, wherein the second auxiliary pattern is spaced apart from the first auxiliary pattern.

3. The method according to claim 1, wherein the second auxiliary pattern overlaps the first auxiliary pattern, and an end of the first auxiliary pattern protrudes beyond the second auxiliary pattern.

4. The method according to claim 1, wherein the bridge pattern partially overlaps the first and second contact holes.

5. The method according to claim 1, wherein the bridge pattern has a smaller thickness than the planarization layer.

6. The method according to claim 1, further comprising:
   forming a thin film transistor including a gate electrode, an active layer, an ohmic contact layer, a source electrode and a drain electrode,
   wherein the thin film transistor is connected to the gate and data lines, and
   wherein the pixel electrode is connected to the drain electrode through a drain contact hole in the planarization layer and the passivation layer.

7. The method according to claim 6, further comprising:
   forming a first dummy semiconductor pattern including first and second dummy patterns under the data line and on the gate insulating layer, and
   forming a second dummy semiconductor pattern including third and fourth dummy patterns under the second auxiliary pattern and on the gate insulating layer.

8. The method according to claim 1, wherein the bridge pattern is positioned at a same layer and is formed of a same material as the planarization layer.

9. The method according to claim 1, wherein the connection pattern is positioned at a same layer as and formed of a same material as the pixel electrode.

10. The method according to claim 1, wherein opposite outer edges of the bridge pattern terminate directly over the first and second auxiliary patterns, respectively.

11. The method according to claim 1, wherein the bridge pattern has a thickness smaller than the planarization layer to prevent disconnection problems in the connection pattern.

12. The method according to claim 1, wherein the bridge pattern has a same thickness as the planarization layer.

13. The method according to claim 1, wherein the bridge pattern contacts the passivation layer, and overlaps an end of the first auxiliary pattern and an end of the second auxiliary pattern.

* * * * *